(12) United States Patent
Kaga

(10) Patent No.: US 10,804,876 B2
(45) Date of Patent: Oct. 13, 2020

(54) PIEZOELECTRIC VIBRATING PIECE AND PIEZOELECTRIC DEVICE

(71) Applicant: NIHON DEMPA KOGYO CO., LTD., Tokyo (JP)

(72) Inventor: Shigetaka Kaga, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 338 days.

(21) Appl. No.: 15/829,991

(22) Filed: Dec. 4, 2017

(65) Prior Publication Data

US 2018/0167051 A1 Jun. 14, 2018

(30) Foreign Application Priority Data

Dec. 12, 2016 (JP) ................... 2016-239960

(51) Int. Cl.
*H03H 9/19* (2006.01)
*H03H 9/13* (2006.01)
(Continued)

(52) U.S. Cl.
CPC .............. *H03H 9/132* (2013.01); *H03H 3/04* (2013.01); *H03H 9/02023* (2013.01);
(Continued)

(58) Field of Classification Search
CPC ...... H03H 9/132; H03H 9/02023; H03H 9/19; H03H 9/0509; H03H 9/1021; H03H 9/02062; H03H 9/177; H01L 41/047
See application file for complete search history.

(56) References Cited

U.S. PATENT DOCUMENTS

| 3,745,385 A * | 7/1973 | Nakajima ............... H03H 9/176 |
| | | 310/358 |
| 2006/0048358 A1* | 3/2006 | Morimura ................ H03H 3/04 |
| | | 29/25.35 |

(Continued)

FOREIGN PATENT DOCUMENTS

JP   62173812 A  * 7/1987
JP   H10308645    11/1998
(Continued)

*Primary Examiner* — J. San Martin
(74) *Attorney, Agent, or Firm* — JCIPRNET

(57) ABSTRACT

A piezoelectric vibrating piece includes a piezoelectric substrate, a first excitation electrode, and a second excitation electrode. The piezoelectric substrate is formed into a flat plate shape and vibrates in a thickness-shear vibration mode. The first excitation electrode is formed on one principal surface of the piezoelectric substrate. The second excitation electrode is formed on another principal surface of the piezoelectric substrate. The first excitation electrode is formed to entirely have an identical thickness. The second excitation electrode has a main thickness portion and an inclined portion. The main thickness portion has a constant thickness. The inclined portion is formed in a peripheral area of the main thickness portion and gradually decreases in thickness from a portion in contact with the main thickness portion to an outermost periphery of the second excitation electrode. The main thickness portion has a thickness larger than the thickness of the first excitation electrode.

6 Claims, 8 Drawing Sheets

(51) Int. Cl.
  *H03H 9/02* (2006.01)
  *H03H 9/05* (2006.01)
  *H03H 9/10* (2006.01)
  *H03H 9/17* (2006.01)
  *H03H 3/04* (2006.01)

(52) U.S. Cl.
  CPC ...... *H03H 9/02062* (2013.01); *H03H 9/0509* (2013.01); *H03H 9/1021* (2013.01); *H03H 9/131* (2013.01); *H03H 9/177* (2013.01); *H03H 9/19* (2013.01); *H03H 2003/0428* (2013.01)

(56) References Cited

U.S. PATENT DOCUMENTS

| | | | |
|---|---|---|---|
| 2007/0046157 A1* | 3/2007 | Onishi | H03H 3/02 310/365 |
| 2008/0048527 A1* | 2/2008 | Yoshio | H03H 3/04 310/348 |
| 2008/0174389 A1* | 7/2008 | Mori | H03H 9/0211 333/189 |
| 2010/0327705 A1* | 12/2010 | Koyama | H03H 9/0211 310/365 |
| 2013/0063227 A1* | 3/2013 | Burak | H03H 9/131 333/187 |
| 2014/0354115 A1* | 12/2014 | Burak | H03H 9/175 310/348 |
| 2018/0115301 A1* | 4/2018 | Kaga | H01L 41/047 |
| 2018/0205364 A1* | 7/2018 | Kaga | H03H 9/02062 |
| 2019/0149124 A1* | 5/2019 | Kaga | H03H 9/132 310/344 |

FOREIGN PATENT DOCUMENTS

| | | |
|---|---|---|
| JP | 2002217675 | 8/2002 |
| JP | 2005318477 | 11/2005 |
| JP | 2009044237 A * | 2/2009 |

* cited by examiner

PIEZOELECTRIC VIBRATING PIECE AND PIEZOELECTRIC DEVICE

CROSS-REFERENCE TO RELATED APPLICATIONS

This application is based on and claims priority under 35 U.S.C. § 119 to Japanese Patent Application No. 2016-239960, filed on Dec. 12, 2016, the entire content of which is incorporated herein by reference.

TECHNICAL FIELD

This disclosure relates to a piezoelectric vibrating piece and a piezoelectric device including an inclined portion in a peripheral area of an excitation electrode.

DESCRIPTION OF THE RELATED ART

A piezoelectric vibrating piece including an excitation electrode on a piezoelectric substrate is formed into a convex shape having a thin thickness in a peripheral area of the piezoelectric substrate. This confines a vibration energy, thereby ensuring restraining an unnecessary vibration. However, there is a problem that forming the piezoelectric substrate into the convex shape requires a processing labor and a cost.

In contrast to this, Japanese Unexamined Patent Application Publication No. 2002-217675 discloses that the processing labor and the cost for the piezoelectric substrate are reduced by forming an inclined portion that includes an excitation electrode gradually decreasing in thickness in a peripheral area of the excitation electrode formed on both principal surfaces while a piezoelectric substrate remains in a flat plate shape.

However, Japanese Unexamined Patent Application Publication No. 2002-217675 has a problem that the inclined portion dissipates when the excitation electrode is trimmed for a frequency adjustment of the piezoelectric vibrating piece, thereby increasing a vibration energy loss.

A need thus exists for a piezoelectric vibrating piece and a piezoelectric device which are not susceptible to the drawback mentioned above.

SUMMARY

According to an aspect of this disclosure, there is provided a piezoelectric vibrating piece that includes a piezoelectric substrate, a first excitation electrode, and a second excitation electrode. The piezoelectric substrate is formed into a flat plate shape. The piezoelectric substrate vibrates in a thickness-shear vibration mode. The first excitation electrode is formed on one principal surface of the piezoelectric substrate. The second excitation electrode is formed on another principal surface of the piezoelectric substrate. The first excitation electrode is formed to entirely have an identical thickness. The second excitation electrode has a main thickness portion and an inclined portion. The main thickness portion is formed to have a constant thickness. The inclined portion is formed in a peripheral area of the main thickness portion. The inclined portion gradually decreases in thickness from a portion in contact with the main thickness portion to an outermost periphery of the second excitation electrode. The main thickness portion has a thickness larger than the thickness of the first excitation electrode.

BRIEF DESCRIPTION OF THE DRAWINGS

The foregoing and additional features and characteristics of this disclosure will become more apparent from the following detailed description considered with reference to the accompanying drawings, wherein:

FIG. 7A is a partial sectional drawing of a piezoelectric vibrating piece 140a.

DETAILED DESCRIPTION

The embodiments of this disclosure will be described in detail with reference to the drawings. The embodiments in the following description do not limit the scope of the disclosure unless otherwise stated.

Configuration of Piezoelectric Device 100 According to First Embodiment

Figure 1A:
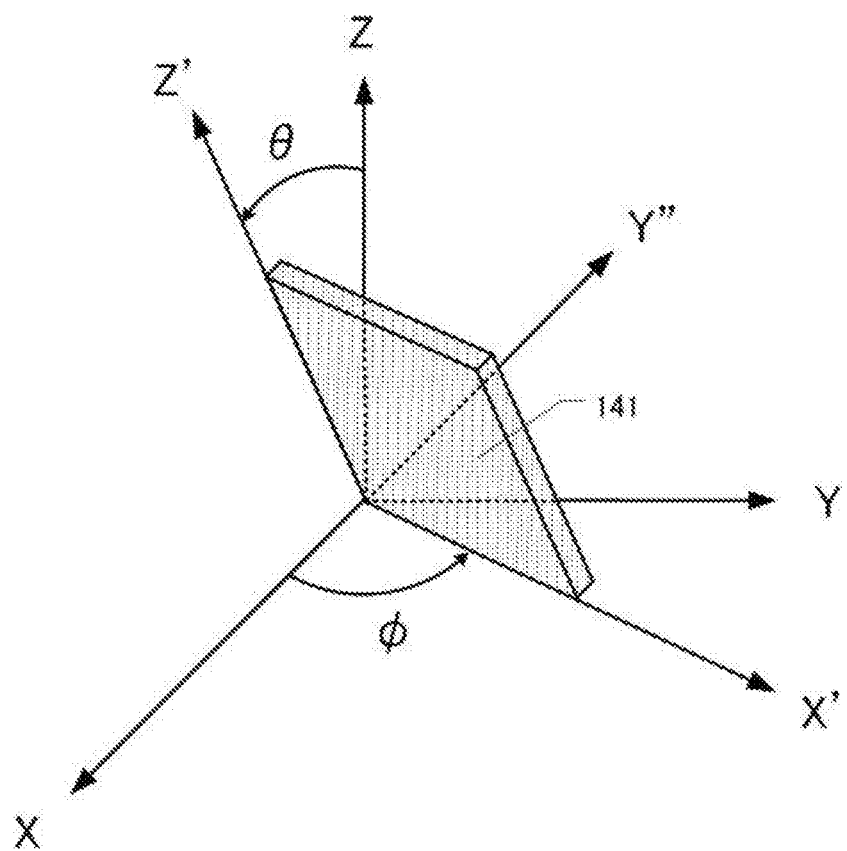
FIG. 1A is an explanatory drawing of an M-SC cut quartz-crystal material.

FIG. 1A is an explanatory drawing of an M-SC cut quartz-crystal material. A piezoelectric device 100 includes a piezoelectric vibrating piece 140. The piezoelectric vibrating piece 140 is formed of a piezoelectric substrate 141 as a base material. The piezoelectric substrate 141 is formed of a Modified-SC (M-SC) cut quartz-crystal material. Hereinafter, a description will be made based on crystallographic axes of the M-SC cut quartz-crystal material illustrated in FIG. 1A.

FIG. 1A denotes the crystallographic axes for a crystal as an X-axis, a Y-axis, and a Z-axis. The M-SC cut quartz-crystal material is one kind of a doubly-rotated cut quartz-crystal material. The M-SC cut quartz-crystal material corresponds to an X'Z'-plate obtained by rotating an XZ-plate of the crystal by $\phi$ degree using the Z-axis of the crystal as a rotational center, and further rotating an X'Z-plate generated by this rotation by $\theta$ degree using the X'-axis as the rotational center. In the case of M-SC cut, $\phi$ is approximately 24 degrees and θ is approximately 34 degrees. FIG. 1A denotes new axes for a crystal element generated in the above-described doubly-rotation as an X'-axis, a Y"-axis, and a Z'-axis. The doubly-rotated cut quartz-crystal material is a quartz-crystal material whose main vibration is what is called a C mode and a B mode that has a shear displacement that propagates in a thickness direction. Vibrations of these C mode and B mode are classified into a thickness-shear vibration similarly to an AT-cut.

Figure 1B:
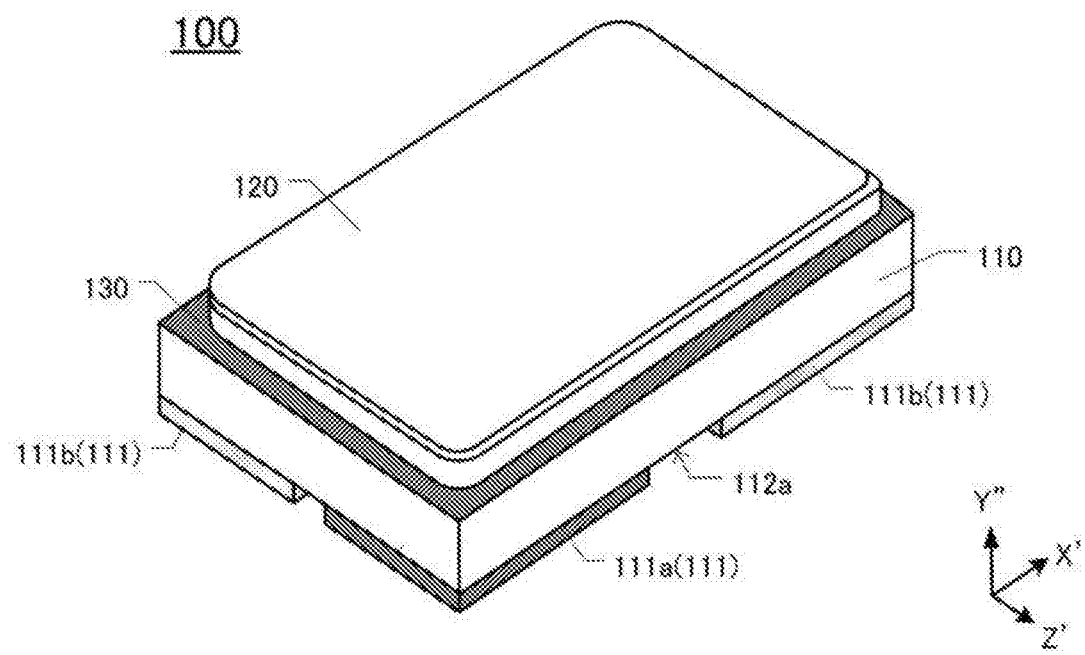
FIG. 1B is a perspective view of a piezoelectric device 100.

FIG. 1B is a perspective view of the piezoelectric device 100. The piezoelectric device 100 is constituted by mainly including a package 110, a lid 120, and the piezoelectric vibrating piece 140 (see FIG. 2A) that vibrates at a predetermined vibration frequency. The piezoelectric device 100 has an outside mainly formed of the package 110 and the lid 120 and an outer shape formed into, for example, an approximately rectangular parallelepiped shape. The piezoelectric device 100 internally includes the piezoelectric vibrating piece 140. The piezoelectric device 100 illustrated in FIG. 1B is formed so as to have a longitudinal direction in an X'-axis direction, a height direction of the piezoelectric device 100 in a Y"-axis direction, and a direction perpendicular to the X'-axis direction and the Y"-axis direction in a Z'-axis direction.

On a mounting surface 112*a* that is a surface on a −Y"-axis side of the package 110 and a surface on which the piezoelectric device 100 is mounted, mounting terminals 111 are formed. The mounting terminal 111 are constituted of hot terminals 111*a* that are terminals connected to the piezoelectric vibrating piece 140 and terminals (hereinafter temporarily referred to as grounding terminals) 111*b* usable for grounding. The package 110 includes the respective hot terminals 111*a* in a corner on a +X'-axis side and a −Z'-axis side and a corner on a −X'-axis side and a +Z'-axis side of the mounting surface 112*a*. The package 110 includes the respective grounding terminals 111*b* in a corner on the +X'-axis side and the +Z'-axis side and a corner on the −X'-axis side and the −Z'-axis side of the mounting surface 112*a*. On a surface in a +Y"-axis side of the package 110, a cavity 113 that is a space in which the piezoelectric vibrating piece 140 is placed is formed (see FIG. 3A). The cavity 113 is sealed with the lid 120 via a sealing material 130.

Figure 2A:
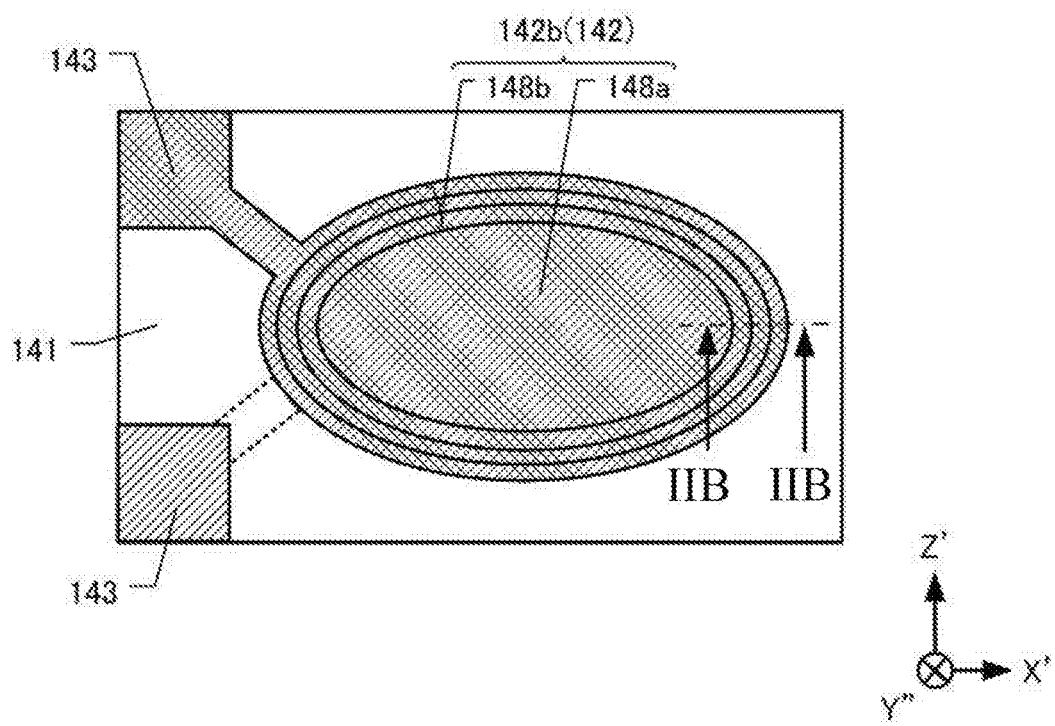
FIG. 2A is a plan view of a piezoelectric vibrating piece 140.

FIG. 2A is a bottom view of the piezoelectric vibrating piece 140. The piezoelectric vibrating piece 140 is constituted by including the piezoelectric substrate 141, excitation electrodes 142, and extraction electrodes 143. The piezoelectric substrate 141 is formed of the M-SC cut quartz-crystal material, which is formed into the flat plate shape and vibrates in the thickness-shear vibration mode. The excitation electrodes 142 are formed on both principal surfaces of the piezoelectric substrate 141 in the +Y"-axis side and −Y"-axis side. The extraction electrodes 143 are extracted to both ends of a side in the −X'-axis side of the piezoelectric substrate 141 from the excitation electrodes 142. The piezoelectric substrate 141 is a flat plate-shaped substrate having a rectangular shaped flat surface whose long sides extending in the X'-axis direction and short sides extending in the Z'-axis direction. The excitation electrode 142 is formed into an elliptical shape whose long axis extending in the X'-axis direction and short axis extending in the Z'-axis direction. The excitation electrodes 142 are constituted of a first excitation electrode 142*a* (see FIG. 2B) and a second excitation electrode 142*b*. The first excitation electrode 142*a* is formed on the surface in the +Y"-axis side of the piezoelectric substrate 141 and the second excitation electrode 142*b* is formed on the −Y"-axis side of the piezoelectric substrate 141. The first excitation electrode 142*a* and the second excitation electrode 142*b* are formed into identical flat surface shapes and identical sizes and formed so as to entirely overlap with one another in the Y"-axis direction. The first excitation electrode 142*a* and the second excitation electrode 142*b* may be formed so as to oppose by shifting with a predetermined relationship so as to have a part not overlapping. The second excitation electrode 142*b* has a main thickness portion 148*a* and an inclined portion 148*b*. The main thickness portion 148*a* is formed to have a constant thickness. The inclined portion 148*b* is formed to have a predetermined width in a peripheral area of the main thickness portion 148*a*. The inclined portion 148*b* gradually decreases in thickness from a portion in contact with the main thickness portion 148*a* to an outermost periphery of the second excitation electrode 142*b*.

Figure 2B:
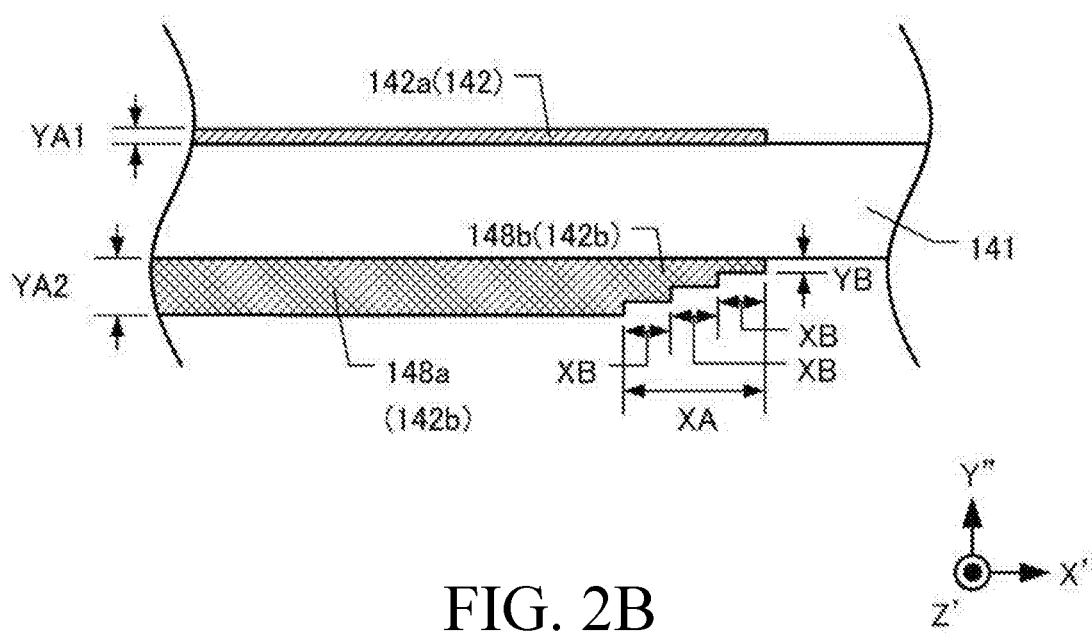
FIG. 2B is a sectional drawing taken along IIB-IIB in FIG. 2A.

FIG. 2B is a sectional drawing taken along IIB-IIB in FIG. 2A. The first excitation electrode 142*a* is formed so as to entirely have an equal thickness YA1. The second excitation electrode 142*b* is formed such that the main thickness portion 148*a* has a constant thickness YA2. Here, the thicknesses of the first excitation electrode 142*a* and the main thickness portion 148*a* are substantially constant. Inevitable variations caused, for example, by variations in products shall be included in "constant." The thickness YA2 has a thickness larger than the thickness YA1. The inclined portion 148*b* of the second excitation electrode 142*b* gradually decreases in thickness from a side of the main thickness portion 148*a* to the outermost periphery of the second excitation electrode 142*b* by forming four level differences. The inclined portion 148*b* has a width from the main thickness portion 148*a* side to the outermost periphery of the second excitation electrode 142 formed to be XA. Widths between each of the level differences are formed to be XB. That is, the width XA is formed to have a length three times the width XB as illustrated in FIG. 2B. A height of each of the level differences of the inclined portion 148*b* is formed to be YB. Therefore, the thickness YA2 has a thickness four times the height YB.

Figure 3A:
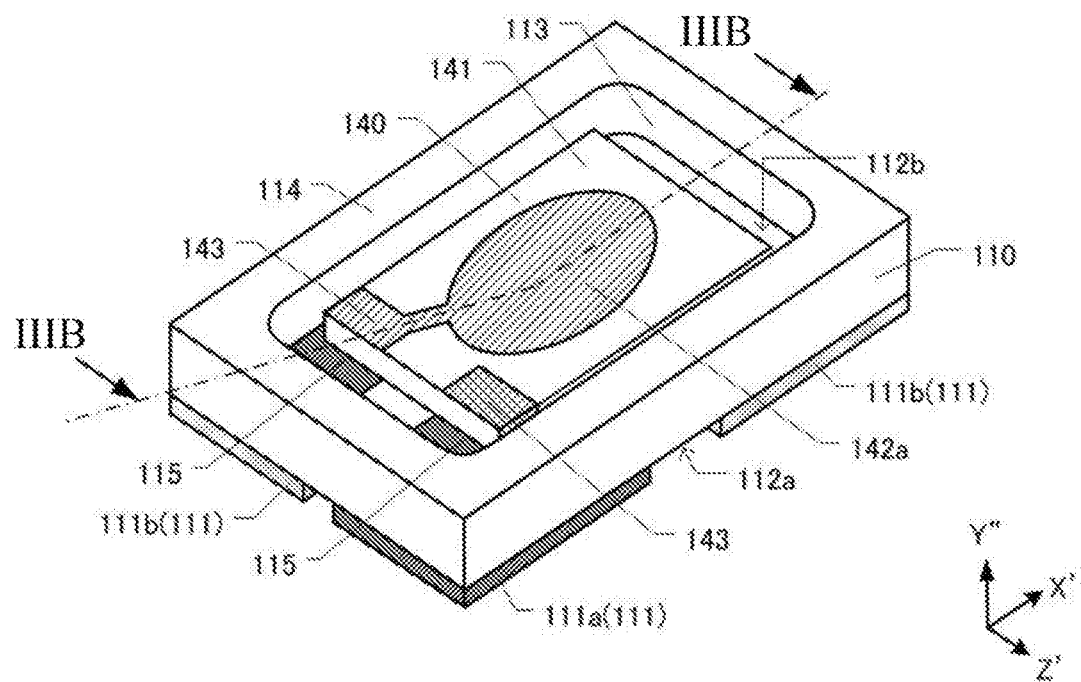
FIG. 3A is a perspective view of the piezoelectric device 100 from which a lid 120 is removed.

FIG. 3A is a perspective view of the piezoelectric device 100 from which the lid 120 is removed. The cavity 113 formed on the surface of the +Y"-axis side of the package 110 is surrounded by a placement surface 112*b* and a sidewall 114. The placement surface 112*b* is a surface on an opposite side of the mounting surface 112*a*. On the placement surface 112*b*, the piezoelectric vibrating piece 140 is placed. The sidewall 114 is formed in a peripheral area of the placement surface 112*b*. The placement surface 112*b* includes a pair of connection electrodes 115 electrically connected to the hot terminals 111*a*. The piezoelectric vibrating piece 140 is placed on the placement surface 112*b* such that the extraction electrodes 143 and the connection electrodes 115 are electrically connected via conductive adhesives 131 (see FIG. 3B).

Figure 3B:
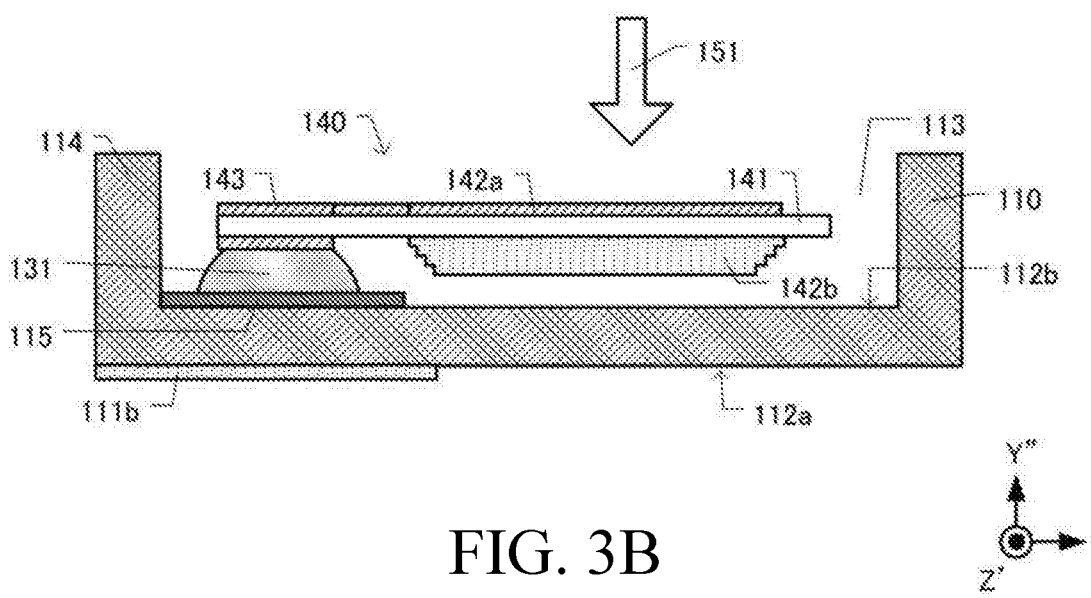
FIG. 3B is a sectional drawing taken along IIIB-IIIB in FIG. 3A.

FIG. 3B is a sectional drawing taken along IIIB-IIIB in FIG. 3A. The piezoelectric vibrating piece 140 is disposed such that the second excitation electrode 142*b* faces the package 110 as illustrated in FIG. 3B. The piezoelectric device 100 has a frequency adjusted after the piezoelectric vibrating piece 140 is placed in the package 110. The frequency adjustment is performed, for example, by irradiating the first excitation electrode 142*a* with an ion beam 151 of Argon (Ar) gas or similar gas and trimming a part of the first excitation electrode 142*a*. In the piezoelectric device 100, the first excitation electrode 142*a* in which the inclined portion is not formed is trimmed. Therefore, the inclined portion is not dissipated when the trimming is performed.

Accordingly, the vibration energy loss does not increase due to the inclined portion dissipation.

[Vibration Energy Loss of Piezoelectric Vibrating Piece]

The following describes a relationship between the thickness of the excitation electrode 142 of the piezoelectric vibrating piece 140 and the vibration energy loss (1/Q). The description is made by comparing a piezoelectric vibrating piece 240 (not illustrated) on which the excitation electrodes with the inclined portions are formed on both the principal surfaces of the piezoelectric substrate 141 and a piezoelectric vibrating piece 340 (not illustrated) on which the excitation electrodes without the inclined portion are formed on both the principal surfaces of the piezoelectric substrate 141. The piezoelectric vibrating piece 240 and the piezoelectric vibrating piece 340 have configurations identical to the piezoelectric vibrating piece 140 except that the inclined portions are formed on both the principal surfaces or not formed on both the principal surfaces of the piezoelectric vibrating piece.

Figure 4:
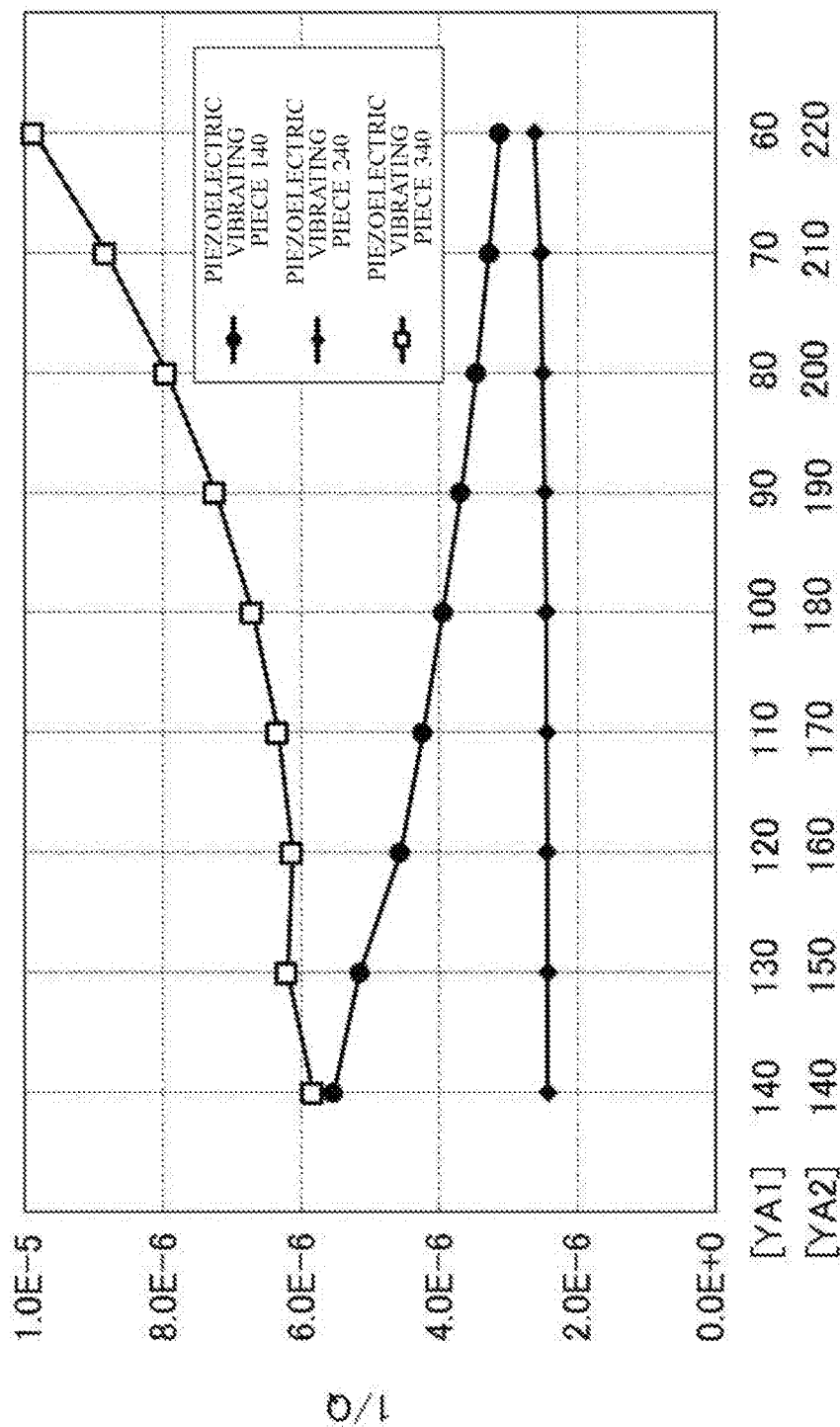
FIG. 4 is a graph showing relationships between thicknesses of excitation electrodes of the piezoelectric vibrating piece 140, a piezoelectric vibrating piece 240, and a piezoelectric vibrating piece 340 and vibration energy losses (1/Q) of a main vibration.

FIG. 4 is a graph showing relationships between the thicknesses of the excitation electrodes of the piezoelectric vibrating piece 140, the piezoelectric vibrating piece 240, and the piezoelectric vibrating piece 340 and the vibration energy losses (1/Q) of the main vibration. More specifically, FIG. 4 is a graph indicating the gist of the embodiment that is the inclined portion is disposed at an end portion of the excitation electrode on one principal surface of the piezoelectric substrate and the thickness of the excitation electrode on the other principal surface is made thinner than the excitation electrode on the one side. In FIG. 4, as an analytical model, there is shown calculation results by a simulation of the case where all the excitation electrodes are formed of gold (Au), the frequencies of the main vibrations are set to 30 MHz (flexural wavelengths $\lambda$ are approximately 95 μm), and the inclination widths XA are set to 133 μm (1.4 times the flexural wavelengths $\lambda$). In the graph in FIG. 4, a horizontal axis indicates the thicknesses YA1 and YA2 of the excitation electrode. Each of the piezoelectric vibrating piece 140, the piezoelectric vibrating piece 240, and the piezoelectric vibrating piece 340 constantly has a total of the thickness YA1 and the thickness YA2 of 280 nm for the thickness of the excitation electrode 142. In FIG. 4, the thickness YA2 increases as approaching the right side of the graph. A vertical axis in FIG. 4 indicates the vibration energy loss (1/Q) of the main vibration (such as C mode). In FIG. 4, the piezoelectric vibrating piece 140 is indicated by a black circle, the piezoelectric vibrating piece 240 is indicated by a black diamond, and the piezoelectric vibrating piece 340 is indicated by an outlined square. The reason why the simulation is carried out under a condition that the total of the thickness YA1 and the thickness YA2 is constantly 280 nm is to ensure what is called an energy confinement in the piezoelectric vibrating piece. That is, it is because confirmation of advantageous effects of the embodiment is desired on the premise that the energy confinement is ensured. However, the value of 280 nm is one example corresponding to a size, a shape, and a frequency of the piezoelectric substrate of the embodiment.

The piezoelectric vibrating piece 140 has 1/Q, which indicates the vibration energy loss, of approximately 5.5×$10^{-6}$ (in the graphs in and after FIG. 4, "×$10^{-6}$" is written as "E-6") when the thickness YA1 and the thickness YA2 are 140 nm. In the piezoelectric vibrating piece 140, thinning the thickness YA1 of the first excitation electrode 142a in which the inclined portion is not formed and thickening the thickness YA2 of the second excitation electrode 142b instead decrease 1/Q. When the thickness YA1 is 60 nm and the thickness YA2 is 220 nm, 1/Q is approximately 3.1×$10^{-6}$. That is, in the piezoelectric vibrating piece 140, it is seen that disposing the inclined portion on an edge of the excitation electrode on one surface of the piezoelectric substrate and thinning the thickness of the other excitation electrode decrease the loss of the piezoelectric vibrating piece. On the other hand, in the piezoelectric vibrating piece 240 that is one of the comparative examples and has the inclined portions in the excitation electrodes on both the surfaces, 1/Q is approximately 2.4×$10^{-6}$ to approximately 2.6×$10^{-6}$ and leveled off even when the thickness YA1 and the thickness YA2 are changed. This looks like a preferable characteristic. However, in the piezoelectric vibrating piece 240, since the excitation electrodes on both the surfaces have the inclined portions, there happens a dissipation of the inclined portion of the excitation electrode on a side of a frequency adjustment surface when the frequency is adjusted. Therefore, this characteristic cannot be maintained in an actual product. In the piezoelectric vibrating piece 340 that is another one of the comparative examples and does not have the inclined portion in the excitation electrodes on both the surfaces, when the thickness YA1 and the thickness YA2 are changed, 1/Q increases as the thickness YA2 increases, and when the thickness YA2 is 220 nm, 1/Q is approximately 9.9×$10^{-6}$. That is, in the piezoelectric vibrating piece 340, the loss increases as the thickness of YA2 thickens since an unnecessary mode caused by the level differences at the edge portion of this excitation electrode occurs.

The effects of the embodiment are generated with the following reasons. In the piezoelectric vibrating piece, there occur the main vibration (such as C mode) and the unnecessary vibration that is a vibration not intended in design unlike the main vibration. In the piezoelectric vibrating piece formed of a quartz-crystal material of, such as AT-cut and M-SC cut, and formed of a piezoelectric substrate that vibrates in the thickness-shear vibration mode, other modes other than the main vibration possibly becomes the unnecessary mode that inhibits oscillation of the main vibration. In the unnecessary vibration that is the vibration by the unnecessary mode, it is known that a flexure vibration especially has an effect on the main vibration. The flexure vibration is superimposed to the main vibration mainly by the vibration energy at the end portion of the excitation electrode being transformed into the flexure vibration. Since the flexure vibration vibrates in the whole piezoelectric vibrating piece, the vibration energy is absorbed by the conductive adhesive with which the piezoelectric vibrating piece is held. The energy loss caused by such flexure vibration leads to the vibration energy loss.

In the piezoelectric vibrating piece 140 according to the embodiment, the value of 1/Q of the piezoelectric vibrating piece 140 is close to the value of 1/Q of the piezoelectric vibrating piece 340 when the thickness YA1 and the thickness YA2 are 140 nm. It is considered that this is because the effect of the flexure vibration on the main vibration is not sufficiently suppressed since even though the piezoelectric vibrating piece 140 includes the inclined portion 148b in the second excitation electrode 142b, the inclined portion is not formed in the first excitation electrode 142a. In the piezoelectric vibrating piece 140, 1/Q decreases as the thickness YA1 of the first excitation electrode 142a gets thinned and is close to 1/Q of the piezoelectric vibrating piece 240 when the thickness YA1 is 60 nm. It is considered that this is because the thinned thickness YA1 of the first excitation electrode 142a reduces the effect of the level differences at the electrode end portion, therefore suppressing the occurrence of the flexure vibration in the first excitation electrode 142a. That is, in the piezoelectric vibrating piece 140, it is better when the thickness of the first excitation electrode 142a without the inclined portion is thinner.

The thickness YA1 of the first excitation electrode 142a is preferred as thin as possible on the premise that the end portion of the first excitation electrode 142a can reduce an induction of the unnecessary mode and ensure an original function of the electrode as a conductive film. From FIG. 4, it is seen that, in the piezoelectric vibrating piece 140, thinning the thickness YA1 can suppress the effect of the flexure vibration on the main vibration. Meanwhile, it is known that, in a thin film technology, the lower limit thickness that can bring a film into existence is in a range of 60 nm to 100 nm. Taking this into consideration, in order to bring out the original function as the electrode of the first excitation electrode 142a, it is necessary to have the thickness YA1 of at least 60 nm to 100 nm, preferably the thickness of 60 nm to 80 nm. That is, the thickness YA1 of the first excitation electrode is preferred to be in a range of 60 nm to 100 nm, preferably, 60 nm to 80 nm.

In the piezoelectric vibrating piece 140, instead of performing processing, such as bevel processing or convex processing, on the piezoelectric substrate 141, which is used, forming the excitation electrode to have a predetermined thickness confines the vibration energy. Accordingly, it is advisable to select the thickness YA2 of the second excitation electrode such that the total thickness of the thickness YA1 of the first excitation electrode and the thickness YA2 of the second excitation electrode becomes a film thickness that can perform the vibration energy confinement. Specifically, the total of the thicknesses of both the excitation electrodes can be determined from values around several % with respect to a plate thickness of the piezoelectric substrate by considering a size, a frequency, and similar factor of the piezoelectric vibrating piece. It is advisable to select, for example, from 2 to 5%. In the piezoelectric vibrating piece 140, thickening the thickness of the second excitation electrode 142b ensures the film thickness of the total of the whole excitation electrodes 142. At the same time, forming the inclined portion 148b in the second excitation electrode 142b prevents the vibration energy from being transformed into the flexure vibration at the end portion of the second excitation electrode 142b.

From FIG. 4, it is seen that forming the thickness of the first excitation electrode 142a thinner than the thickness of the second excitation electrode 142b can decrease 1/Q down to a value close to the case where the inclined portions are formed in the excitation electrodes on both the principal surfaces (the piezoelectric vibrating piece 240) and the piezoelectric vibrating piece can be brought to a state bearable for a practical use. Such trend is applicable to when the quartz-crystal material of another cut, such as AT-cut, SC-cut, and IT-cut, that vibrates in the thickness-shear vibration mode is used or when another piezoelectric material that vibrates in the thickness-shear vibration mode, for example, lithium tantalite (LT) and piezoelectric ceramic, is used for the piezoelectric substrate. Such trend is also applicable to when the excitation electrode is formed into a circular shape.

[Inclination Width]

In the piezoelectric vibrating piece, the vibration energy is prevented from being transformed into the flexure vibration at the end portion of the excitation electrode when the size of the inclination width XA is appropriate. The following describes an appropriate range of the inclination width XA with reference to a piezoelectric vibrating piece 440, a piezoelectric vibrating piece 540, and a piezoelectric vibrating piece 640 in which the inclined surfaces are formed in the excitation electrodes formed on both the principal surfaces.

Figure 5A:
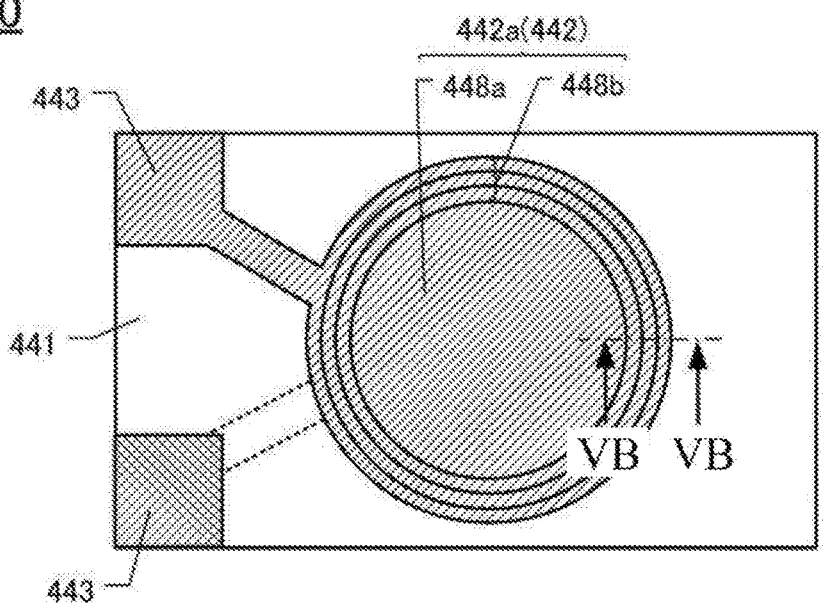
FIG. 5A is a plan view of a piezoelectric vibrating piece 440.

FIG. 5A is a plan view of the piezoelectric vibrating piece 440. The piezoelectric vibrating piece 440 is constituted by forming the excitation electrodes 442 and extraction electrodes 443 on an piezoelectric substrate 441. The piezoelectric substrate 441 is formed using an AT-cut quartz-crystal material that vibrates in the thickness-shear vibration mode as a base material. The AT-cut quartz-crystal material is formed with a principal surface (XZ plane) inclining by 35 degrees 15 minutes from the Z-axis in the −Y-axis direction with the X-axis as a center with respect to the Y-axis of the crystallographic axis (XYZ). In FIG. 5A, the new inclined axes of the AT-cut quartz-crystal material are indicated as a Y'-axis and a Z'-axis. The excitation electrode 442 has a flat surface shape formed into a circular shape. From the excitation electrodes 442, the extraction electrodes 443 are extracted to both ends of a side in a −X-axis side of the piezoelectric substrate 441. The excitation electrode 442 includes a main thickness portion 448a and an inclined portion 448b. A thickness of the main thickness portion 448a is indicated by YA3.

Figure 5B:
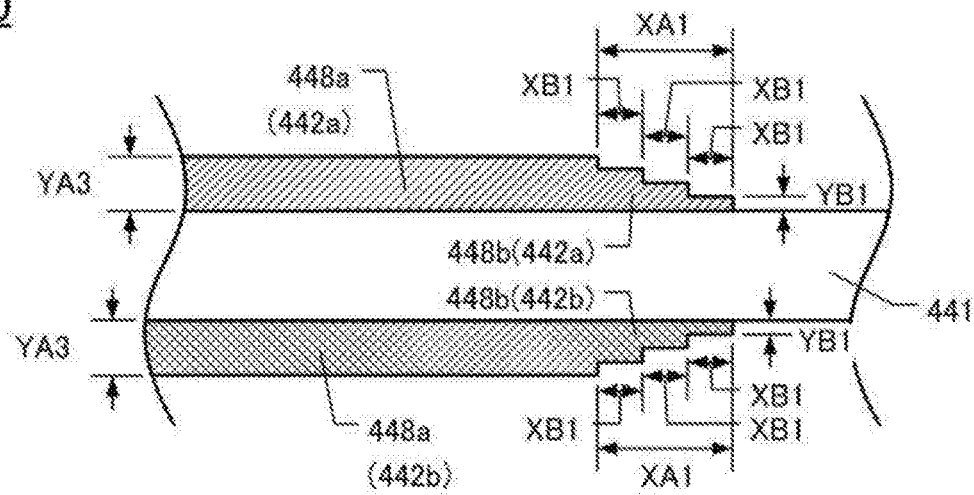
FIG. 5B is a sectional drawing taken along VB-VB in FIG. 5A.

FIG. 5B is a sectional drawing taken along VB-VB in FIG. 5A. The excitation electrodes 442 are constituted of a first excitation electrode 442a and a second excitation electrode 442b. The first excitation electrode 442a is formed on a surface in a +Y'-axis side of the piezoelectric substrate 441. The second excitation electrode 442b is formed on a surface in a −Y'-axis side. The first excitation electrode 442a and the second excitation electrode 442b both have the main thickness portion 448a and the inclined portion 448b. The thickness of the main thickness portion 448a is YA3. The inclined portion 448b has a width from the main thickness portion 448a side to an outermost periphery of the excitation electrode 442 formed to be XA1. The inclined portion 448b gradually decreases in thickness from the main thickness portion 448a side to the outermost periphery of the excitation electrode 442. The inclined portion 448b is formed of four level differences. A width of each of the level difference is formed to be XB1 and a height of each of the level difference is formed to be YB1.

Figure 6A:
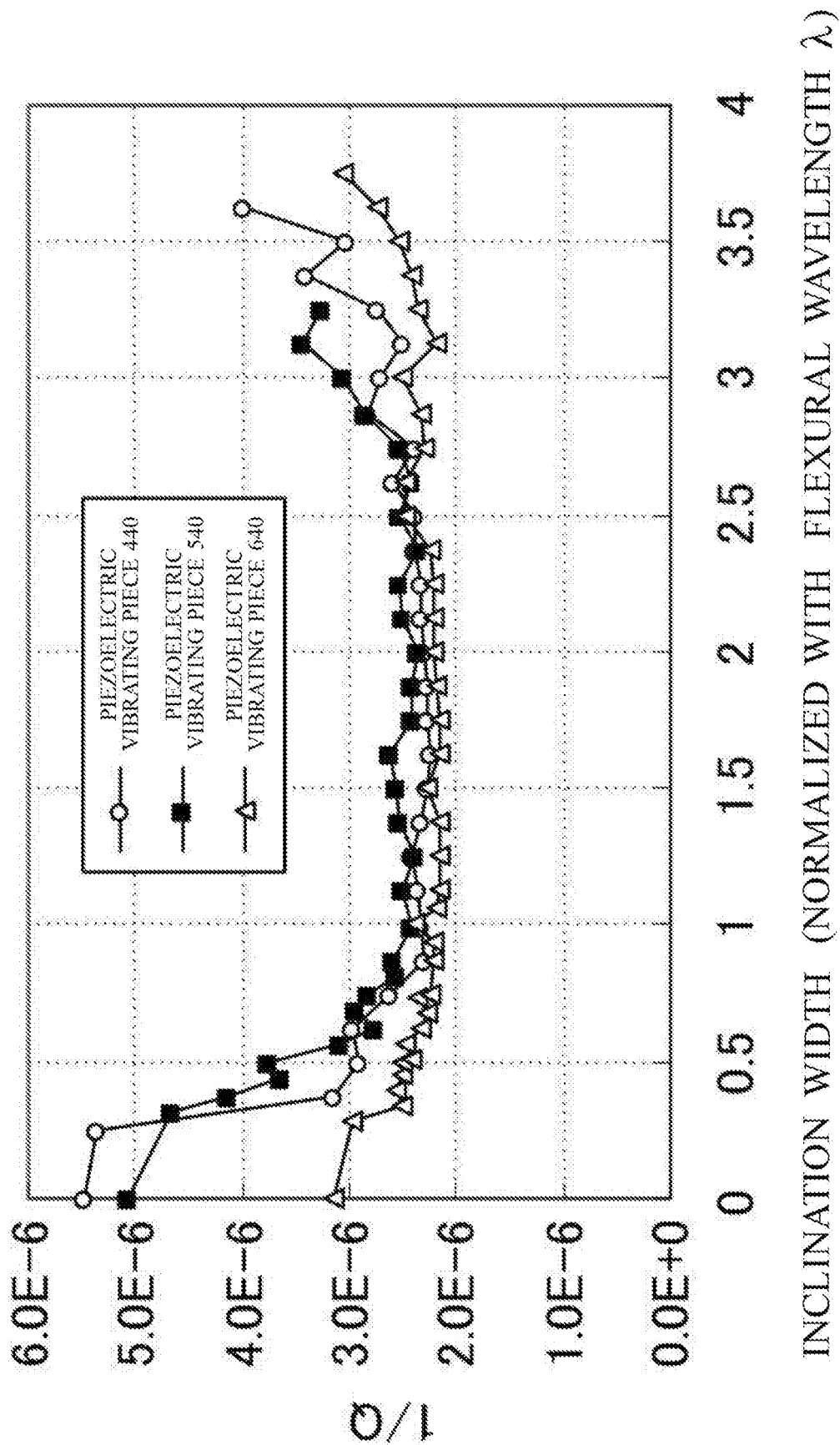
FIG. 6A is a graph showing relationships between inclination widths of the piezoelectric vibrating piece 440, a piezoelectric vibrating piece 540, and a piezoelectric vibrating piece 640 and the vibration energy losses (1/Q) of the main vibration.

FIG. 6A is a graph showing relationships between the inclination widths XA1 of the piezoelectric vibrating piece 440, the piezoelectric vibrating piece 540, and the piezoelectric vibrating piece 640 and the vibration energy losses (1/Q) of the main vibration. The piezoelectric vibrating piece 540 is a piezoelectric vibrating piece whose flat surface shape of the excitation electrode 442 is an elliptical shape in the piezoelectric vibrating piece 440. The piezoelectric vibrating piece 640 is a piezoelectric vibrating piece in which the M-SC cut piezoelectric substrate 141 (see FIG. 2A) is used instead of the piezoelectric substrate 441 in the piezoelectric vibrating piece 440. Other configuration members of the piezoelectric vibrating piece 540 and the piezoelectric vibrating piece 640 are similar to the piezoelectric vibrating piece 440. In FIG. 6A, there is shown calculation results by a simulation of the case where a frequency of the main vibration is 26 MHz (flexural wavelength λ is approximately 100 nm in the AT-cut quartz-crystal material, flexural wavelength λ is approximately 110 nm in the M-SC cut quartz-crystal material) and the thickness YA3 in the main thickness portion of the excitation electrode 442 is 140 mm. In FIG. 6A, the piezoelectric vibrating piece 440 is indicated by an outlined circle, the piezoelectric vibrating piece 540 is indicated by a black-painted square, and the piezoelectric vibrating piece 640 is indicated by an outlined triangle. A horizontal axis in the graph in FIG. 6A indicates the inclination widths that are normalized with the flexural wavelength λ that is a wavelength of the flexure vibration. That is, in FIG. 6A, a value by multiplying the flexural wavelength λ to a numerical value indicated on the horizontal axis is the inclination width by a length unit of the International System of Units.

In FIG. 6A, for the respective piezoelectric vibrating pieces of the piezoelectric vibrating piece 440, the piezoelectric vibrating piece 540, and the piezoelectric vibrating piece 640, 1/Q are low and preferable when the inclination widths are formed to have lengths in a range of 0.5 to 3, that is, the inclination widths are formed to have lengths 0.5 times or more and three times or less the flexural wavelength λ that is the wavelength of the flexure vibration as the unnecessary vibration. Especially, when the inclination widths are formed to have lengths one time or more and 2.5 times or less the flexural wavelength 2, 1/Q is low and stable, therefore more preferable.

Figure 6B:
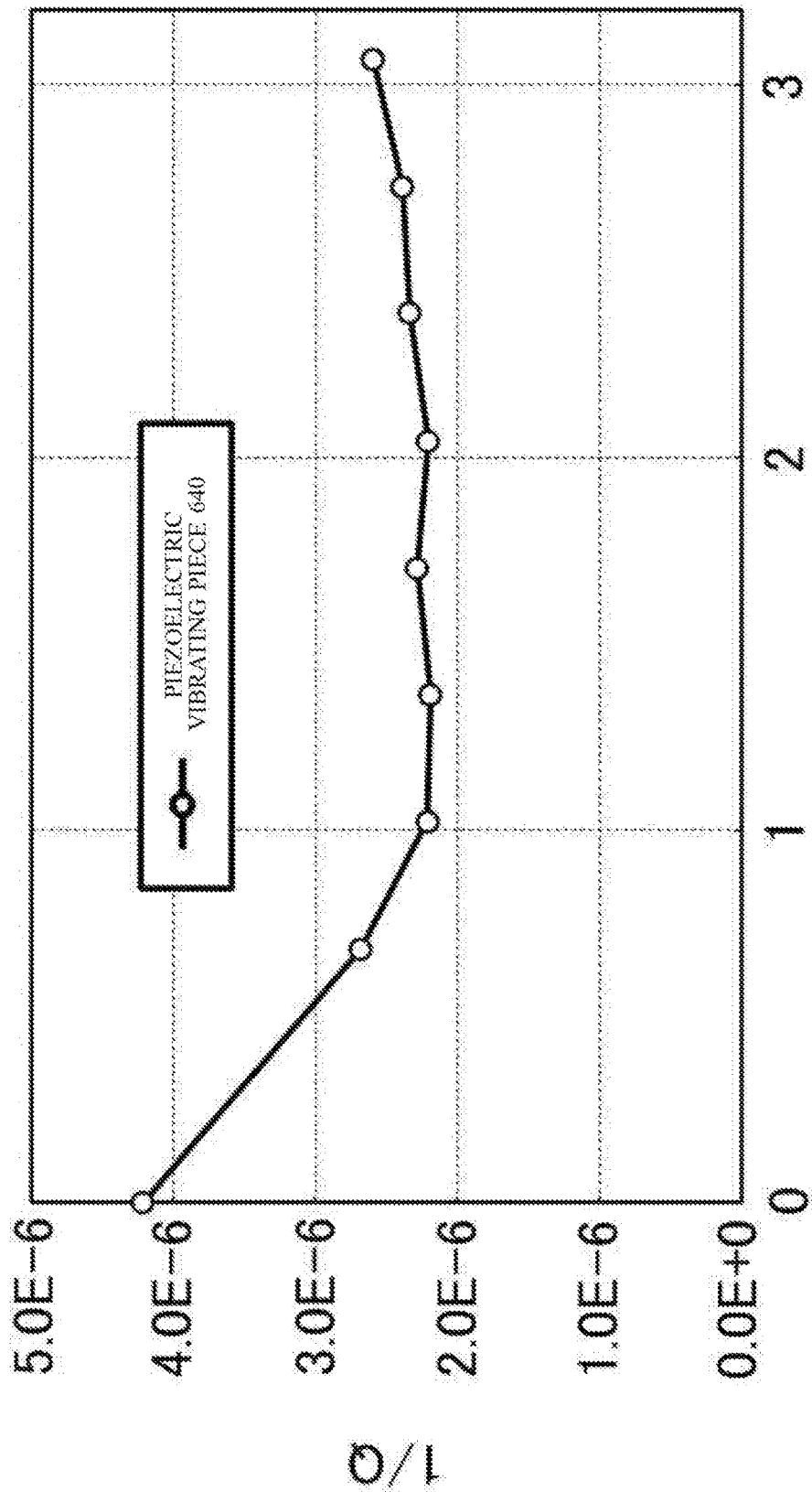
FIG. 6B is a graph showing a relationship between the inclination width of the piezoelectric vibrating piece 640 and the vibration energy loss (1/Q) of the main vibration when a thickness YA3 of an excitation electrode is 100 run.

FIG. 6B is a graph showing a relationship between the inclination width of the piezoelectric vibrating piece 640 and the vibration energy loss (1/Q) of the main vibration when the thickness YA3 of the main thickness portion 448a is 100 nm. As can be seen from this FIG. 6B, even when the thickness of the excitation electrode (the thickness of the main thickness portion 448a) is changed, when the inclination width is formed to have a length 0.5 times or more and three times or less the flexural wavelength λ, it is seen that the vibration energy loss is suppressed. Furthermore, it is seen that the vibration energy loss is further suppressed when the inclination width is formed to have a length one time or more and 2.5 times or less the flexural wavelength λ. Accordingly, even when the thickness of the excitation electrode is changed, it is seen that it is effective to have the inclination width within a range of 0.5 times or more and three times or less, preferably, one time or more and 2.5 times or less the flexural wavelength λ. This trend could be observed even in a range of at least 70 nm to 200 nm of the thickness of the excitation electrode.

From FIG. 6A and FIG. 6B, an appropriate range of the inclination width does not largely depend on the thickness of the excitation electrode. Therefore, the preferable range of the inclination width derived from FIG. 6A and FIG. 6B is applicable to the piezoelectric vibrating piece 140 that has the inclined portion formed only on one principal surface. That is, in the piezoelectric vibrating piece 140, the inclination width XA is preferred to be in a range of 0.5 times or more and three times or less, especially, one time or more and 2.5 times or less the flexural wavelength 2. The range of such inclination width XA is applicable to when the quartz-crystal material of another cut, such as AT-cut, SC-cut, and IT-cut, that vibrates in the thickness-shear vibration mode is used or when another piezoelectric material that vibrates in the thickness-shear vibration mode, for example, lithium tantalite (LT) and piezoelectric ceramic, is used for the piezoelectric substrate. The range of such inclination width XA is also applicable to when the excitation electrode is formed into a circular shape.

Second Embodiment

While the simulation result is shown in the first embodiment, the inclined portion of the actual excitation electrode can be formed by a various method. The following describes a piezoelectric vibrating piece 140a, a piezoelectric vibrating piece 140b, and a piezoelectric vibrating piece 140c that are actual formation examples of the piezoelectric vibrating piece 140 illustrated in FIG. 2A and FIG. 2B.

Figure 7A:
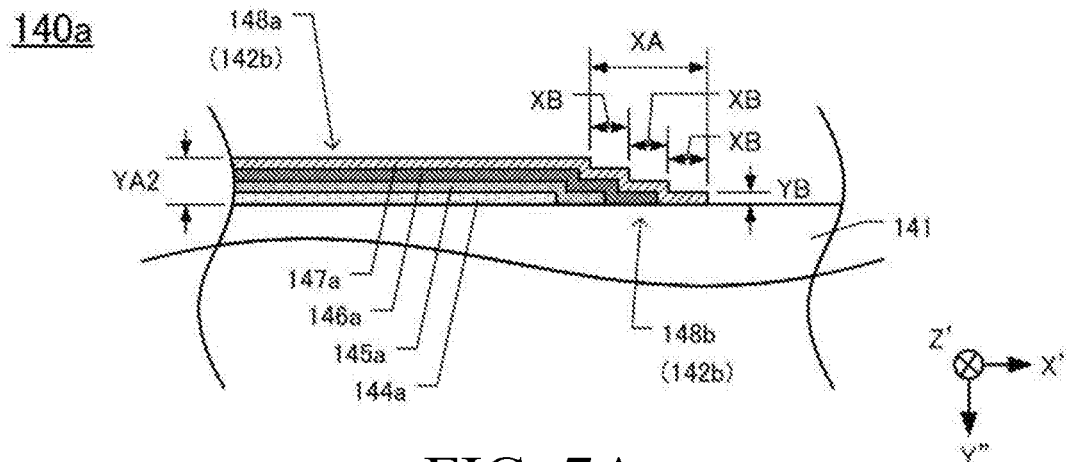

FIG. 7A is a partial sectional drawing of the piezoelectric vibrating piece 140a. FIG. 7A is a partial sectional drawing including a cross-sectional surface corresponding to the IIB-IIB cross-sectional surface in FIG. 2A. The second excitation electrode 142b of the piezoelectric vibrating piece 140a is formed by including a first layer 144a, a second layer 145a, a third layer 146a, and a fourth layer 147a. The second layer 145a is formed so as to cover the first layer 144a. The third layer 146a is formed so as to cover the second layer 145a. The fourth layer 147a is formed so as to cover the third layer 146a. These first layer 144a to fourth layer 147a can be formed by, for example, sputtering or evaporation. As illustrated in FIG. 7A, areas of the laminated layers gradually increasing in size can form the inclination of the inclined portion 148b. In FIG. 7A, only four layers are illustrated, and a base layer that is usually disposed in order to ensure adhesion between the piezoelectric substrate 141 and a metal for the excitation electrode is omitted from illustration. The base layer is, for example, a chrome film.

Figure 7B:
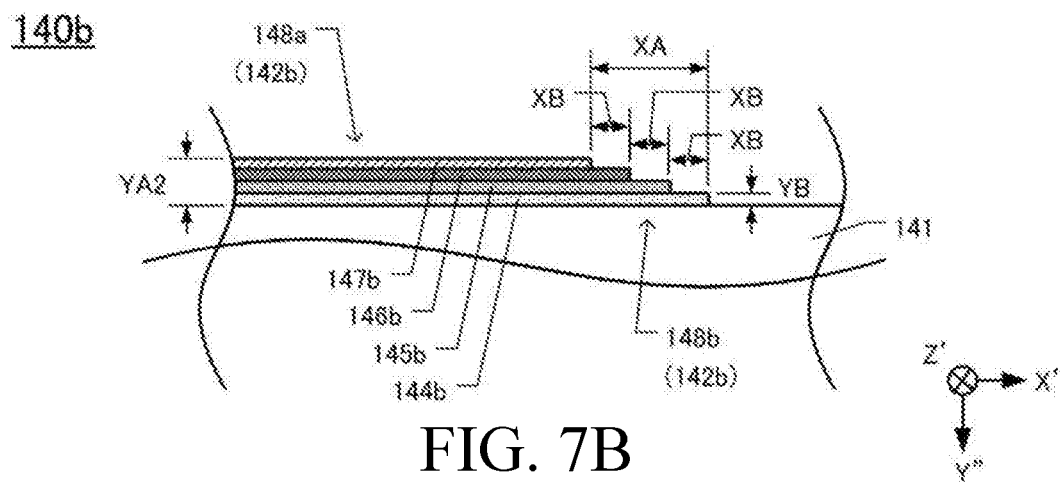
FIG. 7B is a partial sectional drawing of a piezoelectric vibrating piece 140b.

FIG. 7B is a partial sectional drawing of the piezoelectric vibrating piece 140b. FIG. 7B is a partial sectional drawing including a cross-sectional surface corresponding to the IIB-IIB cross-sectional surface in FIG. 2A. The second excitation electrode 142b of the piezoelectric vibrating piece 140b is formed by including a first layer 144b, a second layer 145b, a third layer 146b, and a fourth layer 147b. The second layer 145b is formed on a surface of the first layer 144b with a smaller area than the first layer 144b has. The third layer 146b is formed on a surface of the second layer 145b with a smaller area than the second layer 145b has. The fourth layer 147b is formed on a surface of the third layer 146b with a smaller area than the third layer 146b has. These first layer 144b to fourth layer 147b can be formed by, for example, sputtering or evaporation. Contrary to the case of FIG. 7A, the areas of the laminated layers gradually decreasing in size can also form the inclination of the inclined portion 148b as illustrated in FIG. 7B.

Figure 7C:
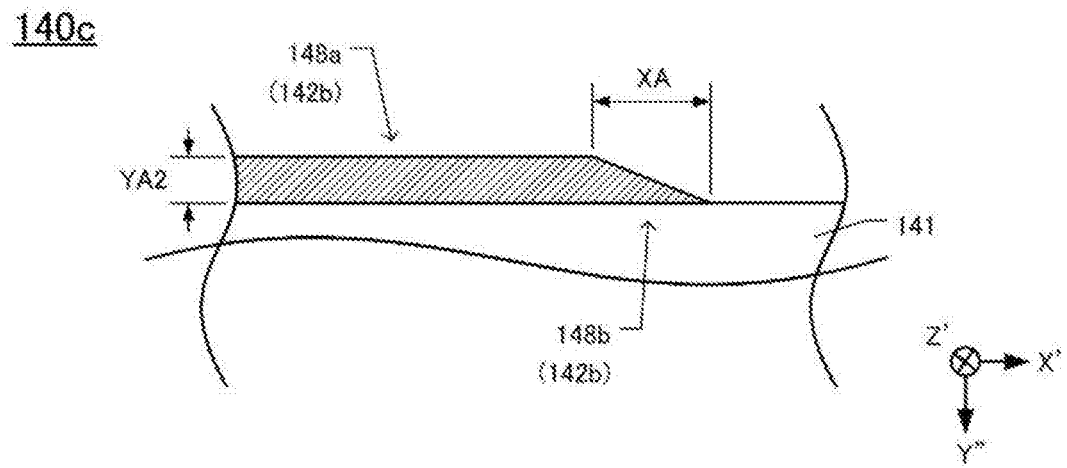
FIG. 7C is a partial sectional drawing of a piezoelectric vibrating piece 140c.

FIG. 7C is a partial sectional drawing of the piezoelectric vibrating piece 140c. FIG. 7C is a partial sectional drawing including a cross-sectional surface corresponding to the IIB-IIB cross-sectional surface in FIG. 2A. The inclination of the inclined portion 148b of the second excitation electrode 142b may be formed of an inclined surface as illustrated in FIG. 7C instead of the level differences. The inclined surface of such inclined portion 148b can be formed, for example, by adjusting a thickness of a resist with the photolithography technology or forming an inclined surface by pruning a part of the excitation electrode by ion beam trimming or similar method after a film formation of the excitation electrode.

The preferred embodiments of this disclosure are described above in detail. It is apparent to those skilled in the art that a variety of variation and modification of the embodiment can be made within the technical scope of this disclosure.

For example, while the level differences of the inclined portion in the above-described embodiments is four levels, the level differences are not limited to four levels and may be more or less than these. The above-described embodiments may be variously combined and incorporated.

The piezoelectric vibrating piece of a second aspect according to the first aspect is configured as follows. The inclined portion has an inclination width as a width of the inclined portion. The inclination width is formed to have a length of 0.5 times or more and three times or less a flexural wavelength that is a wavelength of a flexure vibration as an unnecessary vibration.

The piezoelectric vibrating piece of a third aspect according to the second aspect is configured as follows. The inclination width as the width of inclined portion is formed to have a length of one time or more and 2.5 times or less the flexural wavelength that is the wavelength of the flexure vibration as the unnecessary vibration.

The piezoelectric vibrating piece of a fourth aspect according to the first to the third aspects is configured as follows. The first excitation electrode is formed to have a thickness that reduces an induction of an unnecessary mode at an end portion of the first excitation electrode and ensures an original function of an electrode as a conductive film. Specifically, the first excitation electrode is formed to have a thickness in a range of 60 nm to 100 nm, more preferably, a thickness in a range of 60 nm to 80 nm.

The piezoelectric vibrating piece of a fifth aspect according to the first to the fourth aspects is configured as follows. The first excitation electrode and the second excitation electrode have outer shapes formed into a circular shape or an elliptical shape.

A piezoelectric device of a sixth aspect includes the piezoelectric vibrating piece according to the first to the fifth aspects and a package in which the piezoelectric vibrating piece is placed. The piezoelectric vibrating piece is disposed such that the second excitation electrode faces the package.

With the piezoelectric vibrating piece and the piezoelectric device according to the disclosure, the unnecessary vibration can be suppressed and the vibration energy loss when the frequency is adjusted can be prevented.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibrating piece, comprising:
    a piezoelectric substrate, formed into a flat plate shape and vibrated in a thickness-shear vibration mode;
    a first excitation electrode, formed on one principal surface of the piezoelectric substrate; and
    a second excitation electrode, formed on another principal surface of the piezoelectric substrate, wherein
    the first excitation electrode is formed to entirely have an identical thickness,
    the second excitation electrode has a main thickness portion and an inclined portion, the main thickness portion being formed to have a constant thickness, the inclined portion being formed in a peripheral area of the main thickness portion, the inclined portion gradually decreasing in thickness from a portion in contact with the main thickness portion to an outermost periphery of the second excitation electrode, and
    the main thickness portion has a thickness larger than a thickness of the first excitation electrode,
    wherein the inclined portion has an inclination width as a width of the inclined portion,
    the inclination width being formed to have a length of 0.5 times or more and three times or less a flexural wavelength that is a wavelength of a flexure vibration as an unnecessary vibration.

2. The piezoelectric vibrating piece according to claim 1, wherein
    the inclination width as the width of inclined portion is formed to have a length of one time or more and 2.5 times or less the flexural wavelength that is the wavelength of the flexure vibration as the unnecessary vibration.

3. The piezoelectric vibrating piece according to claim 1, wherein
    the first excitation electrode is formed to have a thickness that reduces an induction of an unnecessary mode at an end portion of the first excitation electrode and ensures an original function of an electrode as a conductive film,
    the second excitation electrode has a thickness that makes a total thickness with the thickness of the first excitation electrode, the total thickness ensuring an energy confinement of the piezoelectric vibrating piece.

4. The piezoelectric vibrating piece according to claim 1, wherein
    the first excitation electrode is formed to have a thickness in a range of 60 nm to 100 nm.

5. The piezoelectric vibrating piece according to claim 1, wherein
    the first excitation electrode and the second excitation electrode have outer shapes formed into a circular shape or an elliptical shape.

6. A piezoelectric device, comprising:
    the piezoelectric vibrating piece according claim 1; and
    a package, in which the piezoelectric vibrating piece is placed, wherein
    the piezoelectric vibrating piece is disposed such that the second excitation electrode faces the package.

* * * * *